(12) United States Patent
Morita et al.

(10) Patent No.: US 9,661,741 B2
(45) Date of Patent: May 23, 2017

(54) PRINTED WIRING BOARD

(71) Applicant: IBIDEN CO., LTD., Ogaki (JP)

(72) Inventors: Haruhiko Morita, Ogaki (JP); Shinobu Kato, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/189,221

(22) Filed: Jun. 22, 2016

(65) Prior Publication Data
US 2016/0374192 A1 Dec. 22, 2016

(30) Foreign Application Priority Data
Jun. 22, 2015 (JP) .................................. 2015-124755

(51) Int. Cl.
H05K 1/02 (2006.01)
H05K 1/03 (2006.01)
H05K 1/11 (2006.01)

(52) U.S. Cl.
CPC ......... *H05K 1/0251* (2013.01); *H05K 1/0213* (2013.01); *H05K 1/0242* (2013.01); *H05K 1/036* (2013.01); *H05K 1/116* (2013.01); *H05K 2201/096* (2013.01)

(58) Field of Classification Search
CPC .... H05K 1/0251; H05K 1/036; H05K 1/0242; H05K 1/116; H05K 1/0213; H05K 2201/096
See application file for complete search history.

(56) References Cited

U.S. PATENT DOCUMENTS

| | | | | |
|---|---|---|---|---|
| 6,747,217 B1* | 6/2004 | Jochym | .................. | H01R 12/58 174/265 |
| 2002/0153167 A1* | 10/2002 | Miller | .................... | H05K 1/115 174/261 |
| 2002/0179332 A1* | 12/2002 | Uematsu | ................ | H05K 1/115 174/262 |

(Continued)

FOREIGN PATENT DOCUMENTS

JP 2011-258997 A 12/2011

*Primary Examiner* — Hoa C Nguyen
(74) *Attorney, Agent, or Firm* — Oblon, McClelland, Maier & Neustadt, L.L.P.

(57) ABSTRACT

A printed wiring board includes conductive layers, resin insulation layers, a through-hole conductor penetrating through one or more insulation layers and having a first-surface-side and second-surface-side lands, a first-surface-side signal line formed on one of the insulation layers and connecting the first-surface-side land and a conductive layer on the insulation layer, and a second-surface-side signal line formed on one of the insulation layers and connecting the second-surface-side land and a conductive layer on the insulation layer. The conductive layers include a first-surface-side conductive layer formed over the first-surface-side land such that the first-surface-side conductive layer has a solid pattern having an opening corresponding to the first-surface-side land and formed concentric with the first-surface-side land, and a second-surface-side conductive layer formed over the second-surface-side land such that the second-surface-side conductive layer has a solid pattern having an opening corresponding to the second-surface-side land and formed concentric with the second-surface-side land.

20 Claims, 7 Drawing Sheets

(56) References Cited

U.S. PATENT DOCUMENTS

| | | | | |
|---|---|---|---|---|
| 2004/0196122 A1* | 10/2004 | Fisher | H01P 1/047 | 333/246 |
| 2007/0029106 A1* | 2/2007 | Kato | H01L 23/49822 | 174/255 |
| 2009/0056999 A1* | 3/2009 | Kashiwakura | H05K 1/0251 | 174/262 |
| 2011/0209905 A1* | 9/2011 | Morita | H05K 1/0222 | 174/257 |
| 2013/0057365 A1* | 3/2013 | Mizushima | H01P 1/047 | 333/238 |
| 2013/0146345 A1* | 6/2013 | Kajihara | H05K 1/0298 | 174/258 |
| 2015/0027758 A1* | 1/2015 | Maeda | H05K 3/421 | 174/255 |

* cited by examiner

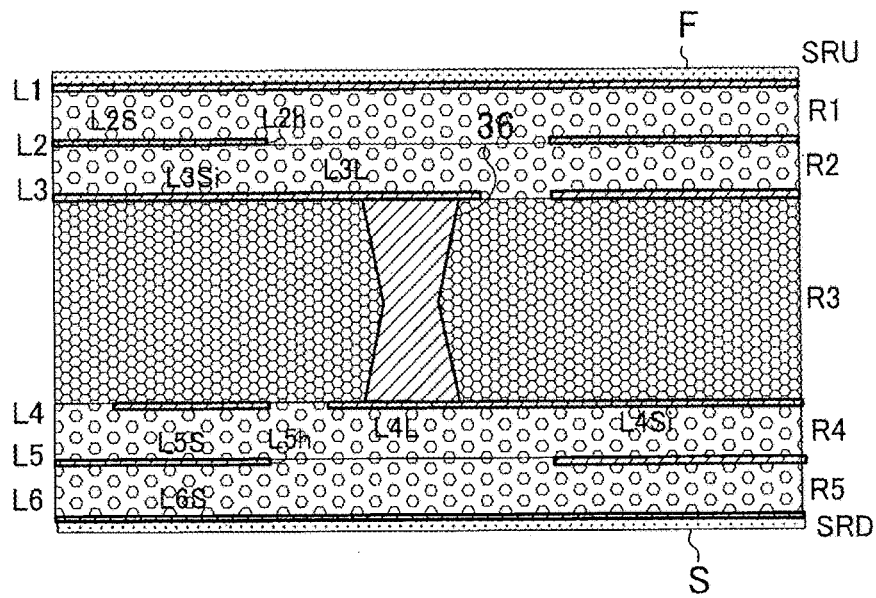
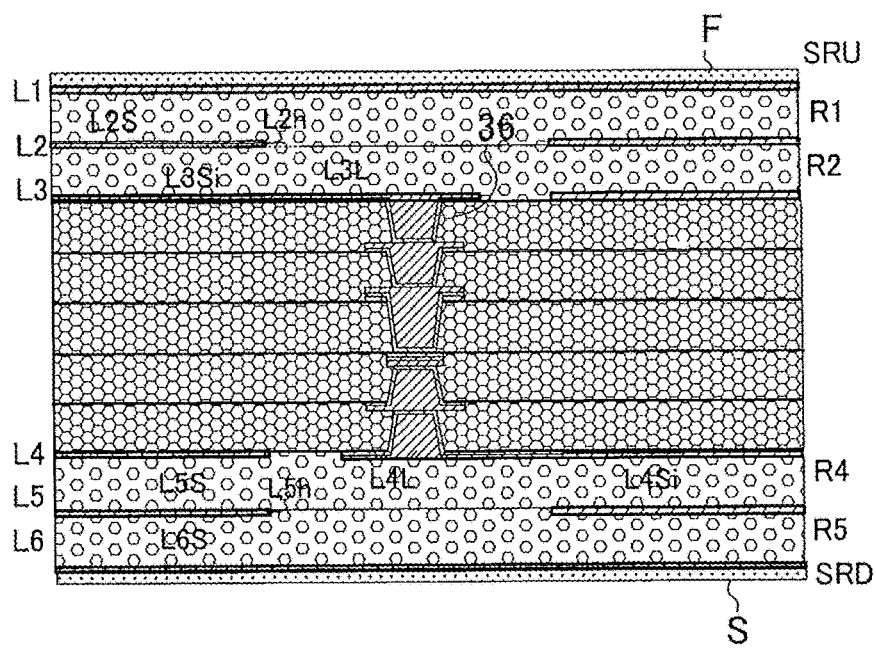

Prior Art

PRINTED WIRING BOARD

CROSS-REFERENCE TO RELATED APPLICATIONS

The present application is based upon and claims the benefit of priority to Japanese Patent Application No. 2015-124755, filed Jun. 22, 2015, the entire contents of which are incorporated herein by reference.

BACKGROUND OF THE INVENTION

Field of the Invention

The present invention relates to a multilayer printed wiring board capable of responding to high-frequency signals.

Description of Background Art

JP2011-258997A describes a buildup multilayer printed wiring board, where a conductive layer on the core substrate is made thicker to reduce conductor resistance so as to allow the wiring board to respond to high-frequency signals. The entire contents of this publication are incorporated herein by reference.

SUMMARY OF THE INVENTION

According to one aspect, a printed wiring board includes conductive layers, resin insulation layers, a through-hole conductor penetrating through one or more of the resin insulation layers such that the through-hole conductor has a first-surface-side land and a second-surface-side land, a first-surface-side signal line formed on one of the resin insulation layers such that the first-surface-side signal line is connecting the first-surface-side land and one of the conductive layers on the one of the resin insulation layers, and a second-surface-side signal line formed on one of the resin insulation layers such that the second-surface-side signal line is connecting the second-surface-side land and one of the conductive layers on the one of the resin insulation layers. The conductive layers include a first-surface-side conductive layer formed over the first-surface-side land of the through-hole conductor such that the first-surface-side conductive layer has a solid pattern having an opening portion corresponding to the first-surface-side land and formed concentric with the first-surface-side land, and a second-surface-side conductive layer formed over the second-surface-side land of the through-hole conductor such that the second-surface-side conductive layer has a solid pattern having an opening portion corresponding to the second-surface-side land and formed concentric with the second-surface-side land.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6A is a cross-sectional view of a printed wiring board according to a third modified example of the embodiment;

FIG. 6B is a cross-sectional view of a printed wiring board according to a fourth modified example of the embodiment.

DETAILED DESCRIPTION OF THE EMBODIMENTS

Figure 1A:
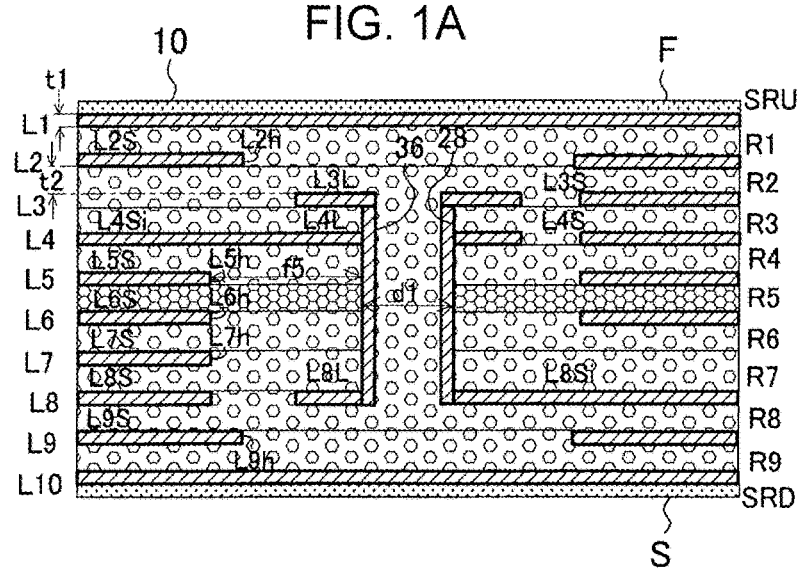
FIG. 1A is a cross-sectional view of a printed wiring board according to an embodiment of the present invention.

The embodiments will now be described with reference to the accompanying drawings, wherein like reference numerals designate corresponding or identical elements throughout the various drawings.

Embodiment

FIG. 1A is a cross-sectional view showing through-hole conductor 36 of printed wiring board 10 according to an embodiment. Printed wiring board 10 is a laminated substrate having a first surface (upper surface) (F) and second surface (lower surface) (S). The printed wiring board is formed with first conductive layer (L1), second conductive layer (L2), third conductive layer (L3), fourth conductive layer (L4), fifth conductive layer (L5), sixth conductive layer (L6), seventh conductive layer (L7), eighth conductive layer (L8), ninth conductive layer (L9), and tenth conductive layer (L10). In the printed wiring board, first resin insulation layer (R1) is formed between first and second conductive layers (L1, L2), second resin insulation layer (R2) is formed between second and third conductive layers (L2, L3), third resin insulation layer (R3) is formed between third and fourth conductive layers (L3, L4), fourth resin insulation layer (R4) is formed between fourth and fifth conductive layers (L4, L5), and fifth resin insulation layer (R5) is formed between fifth and sixth conductive layers (L5, L6). Fifth resin insulation layer (R5) is the core substrate positioned in the center of the printed wiring board. Sixth resin insulation layer (R6) is formed between sixth and seventh conductive layers (L6, L7), seventh resin insulation layer (R7) is formed between seventh and eighth conductive layers (L7, L8), eighth resin insulation layer (R8) is formed between eighth and ninth conductive layers (L8, L9), and ninth resin insulation layer (R9) is formed between ninth and tenth conductive layers (L9, L10). Upper solder-resist layer (SRU) is formed on first conductive layer (L1), and lower solder-resist layer (SRD) is formed on tenth conductive layer (L10). Through-hole conductor 36 penetrates through third, fourth, fifth, sixth and seventh resin insulation layers (R3, R4, R5, R6, R7).

Figure 1B:
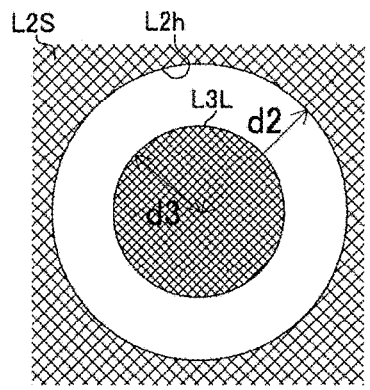
FIG. 1B is a plan view showing second and third conductive layers seen from the surface (F) side.
Figure 1C:
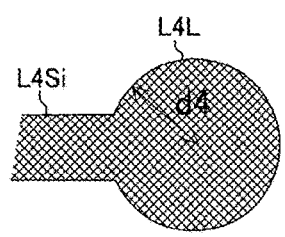
FIG. 1C is a plan view showing through-hole land (L4L) and signal line (L4Si)
Figure 1D:
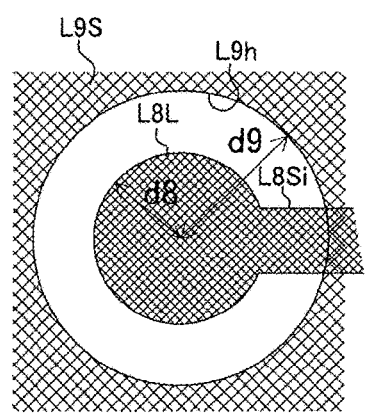
FIG. 1D is a plan view showing ninth and eighth conductive layers seen from the surface (S) side.

First conductive layer (L1) and tenth conductive layer (L10) are entirely solid patterns, whereas second conductive layer (L2) is formed to be solid pattern (L2S) having opening (L2h), and third conductive layer (L3) is formed to have through-hole land (L3L) and solid pattern (L3S). FIG. 1B is a plan view showing second and third conductive layers (L2, L3) seen from the surface (F) side. Opening (L2h) in solid pattern (L2S) is set to be concentric with through-hole land (L3L). Fourth conductive layer (L4) is formed to have through-hole land (L4L), signal line (L4Si) connected to through-hole land (L4L), and solid pattern (L4S). FIG. 1C is a plan view showing through-hole land (L4L) and signal line (L4Si). Fifth conductive layer (L5) is formed to be solid pattern (L5S) having opening (L5h). Sixth conductive layer (L6) is formed to be solid pattern (L6S) having opening (L6h). Seventh conductive layer (L7) is formed to be solid pattern (L7S) having opening (L7h). Eighth conductive layer (L8) is formed to have through-hole land (L8L), signal line (L8Si) connected to through-hole land (L8L), and solid pattern (L8S). Ninth conductive layer (L9) is formed to be solid pattern (L9S) having opening (L9h). FIG. 1D is a plan view showing the ninth and eighth conductive layers (L9, L8) seen from the surface (S) side. Opening (L9h) in solid pattern (L9S) is set to be concentric with through-hole land (L8L).

As shown in FIG. 1A, outer diameter (d1) of through-hole conductor 36 (diameter of penetrating hole 28 for a through-hole conductor) is set at 200 μm. Distance (f5) from the surface of the through-hole conductor to opening (L5h) is 400 μm. Thickness (t2) of second resin insulation layer (R2) (distance from the upper surface of third conductive layer (L3) to the lower surface of second conductive layer (L2)) is 60 μm. The thicknesses of other resin insulation layers are each the same as that of the second resin insulation layer. Each thickness (t1) of first through tenth conductive layers is 25 μm. In FIGS. 1B, 1C and 1D, radius (d3) of through-hole land (L3L) of the third conductive layer, radius (d4) of through-hole land (L4L) of the fourth conductive layer, and radius (d8) of through-hole land (L8L) of the eighth conductive layer are each 225 μm. Radius (d2) of opening (L2h) in the second conductive layer and radius (d9) of opening (L9h) in the ninth conductive layer are each 500 μm.

Solid pattern (L2S) of the second conductive layer, in which opening (L2h) is formed over the first surface of first-surface (F) side through-hole land (L3L) of a through-hole conductor, is positioned opposite through-hole land (L3L) with resin insulation layer (R2) present in between. Solid pattern (L9S) of the ninth conductive layer, in which opening (L9h) is formed over the second surface of through-hole land (L8L) of the eighth conductive layer positioned on the second-surface (S) side of the through-hole conductor, is positioned opposite through-hole land (L8L) with resin insulation layer (R8) present in between.

The first through ninth resin insulation layers contain epoxy thermosetting resin and inorganic particles such as glass particles. Each resin insulation layer may further contain core material such as glass cloth. The dielectric constant of the first through ninth resin insulation layers, upper solder-resist layer (SRU) and lower solder-resist layer (SRD) is in a range of 3.6~4.3.

In the printed wiring board of the present embodiment, to correspond to through-hole land (L3L) of the third conductive layer positioned on the first-surface (F) side of through-hole conductor 36, opening (L2h) concentric with the through-hole land (L3L) is formed in solid pattern (L2S) of the second conductive layer on the first-surface side. To correspond to through-hole land (L8L) of the eighth conductive layer positioned on the second-surface (S) side of through-hole conductor 36, opening (L9h) concentric with the through-hole land (L8L) is formed in solid pattern (L9S) of the ninth conductive layer on the second-surface side. Because of opening (L2h), no stray capacitance occurs between through-hole land (L3L) of the third conductive layer and solid pattern (L2S) on the first-surface side; and because of opening (L9h), no stray capacitance occurs between through-hole land (L8L) of the eighth conductive layer and solid pattern (L9S) of the ninth conductive layer on the second-surface side. Accordingly, impedance of through-hole conductor 36 increases, impedance matching is achieved with wiring lines, and attenuation of high-frequency signals is thereby alleviated.

The ratio of radius (d2) of opening (L2h) of the second conductive layer to the radius (d3) of through-hole land (L3L) of the third conductive layer, as well as the ratio of radius (d9) of opening (L9h) of the ninth conductive layer to radius (d8) of through-hole land (L8L) of the eighth conductive layer, is preferred to be at least 2 to 1 but no greater than 3 to 1. If the ratio is smaller than 2 to 1, stray capacitance occurs between the through-hole land and the solid pattern, and impedance matching is thereby difficult to achieve. If the ratio is greater than 3 to 1, the effects of enhancing impedance are minimal. In addition, such a ratio reduces the area of solid pattern.

In the printed wiring board of the present embodiment, through-hole conductor 36 penetrates through multiple conductive layers (L4, L5, L6, L7) and resin insulation layers (R3, R4, R5, R6, R7). Other than through-hole land (L3L) on the first-surface side and through-hole land (L8L) on the second-surface side, through-hole conductor 36 is not connected to any dummy land that has no connection to power source or ground. In the present embodiment, the first-surface-side through-hole land (L3L) works as an alignment mark when forming penetrating hole 28 for a through-hole, and is a dummy land that has no connection to power source or ground. The second-surface-side through-hole land (L8L) works as an alignment mark when forming penetrating hole 28 for a through hole, and is connected to signal line (L8Si).

Figure 7:
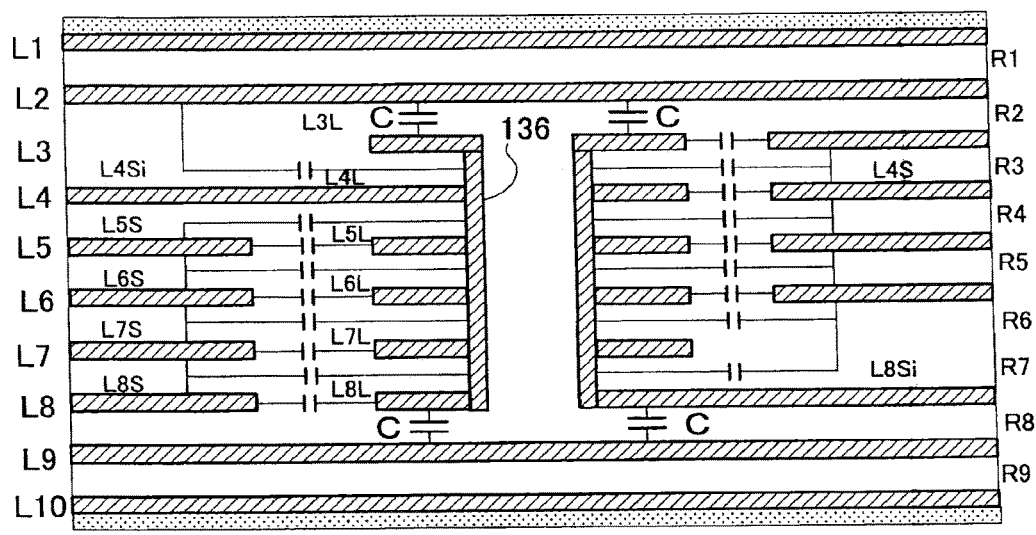
FIG. 7 is a cross-sectional view of a conventional printed wiring board.

In the printed wiring board of the present embodiment, no portion of the through-hole conductor is connected to a dummy land that has no connection to power source or ground. Therefore, stray capacitance, observed between a dummy land and a solid layer in the same conductive layer as shown in FIG. 7, does not occur. Accordingly, impedance increases at through-hole conductor 36, thus achieving impedance matching is achieved with wiring lines, and attenuation of high-frequency signals is alleviated accordingly.

As a result of simulation performed on the wiring structure of a printed wiring board shown in FIG. 1A, it was found that impedance mismatching was reduced 16.9% if an opening corresponding to a through-hole land is formed in a solid pattern. In addition, it was also found that impedance mismatching was reduced 8.1% if no portion of the through-hole conductor was connected to a dummy land that has no connection to power source or ground. It was found that impedance mismatching was reduced 21% when both of the above settings were employed.

First Modified Example of Embodiment

Figure 2:
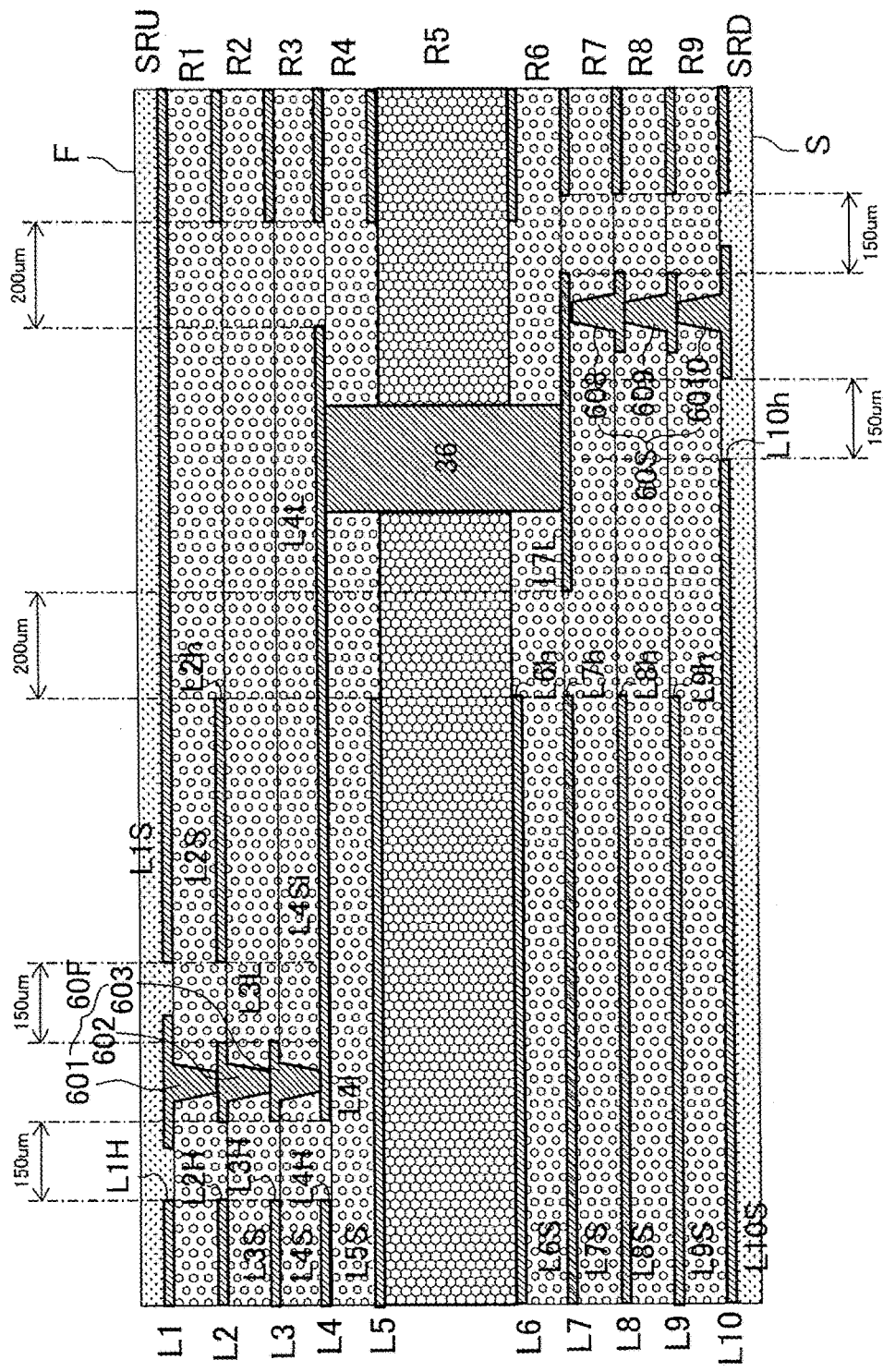
FIG. 2 is a cross-sectional view of a printed wiring board according to a first modified example of the embodiment.

FIG. 2 shows the structure of a printed wiring board according to a first modified example of the embodiment.

A printed wiring board according to the first modified example of the embodiment is formed by buildup laminating resin insulation layers (R1, R2, R3, R4) and conductive layers (L1, L2, L3, L4) on the first-surface (F) side of fifth resin insulation layer (R5), while buildup laminating resin insulation layers (R6, R7, R8, R9) and conductive layers (L7, L8, L9, L10) on the second-surface (S) side. Fifth conductive layer (L5) is formed on the first-surface side of fifth resin insulation layer (R5), and sixth conductive layer (L6) is formed on the second-surface side. Through-hole conductor 36 penetrates through fourth, fifth, and sixth resin insulation layers (R4, R5, R6). Via conductor 601 is formed on first conductive layer (L1) to penetrate through first resin insulation layer (R1). Via conductor 602 is formed on second conductive layer (L2) to penetrate through second resin insulation layer (R2). Via conductor 603 is formed on third conductive layer (L3) to penetrate through third resin insulation layer (R3). Via conductors (601, 602, 603) are formed in a straight line to form stacked via (60F). The bottom portion of via conductor 603 is connected to land (L4l) formed in fourth conductive layer (L4). Land (L4l) is connected to through-hole land (L4L) by way of signal line (L4Si). On the second-surface (S) side of through-hole conductor 36, through-hole land (L7L) is formed as the seventh conductive layer. On through-hole land (L7L), via conductor 608 is formed on eighth conductive layer (L8) to penetrate through seventh resin insulation layer (R7). Via conductor 609 is formed on ninth conductive layer (L9) to penetrate through eighth resin insulation layer (R8). Via conductor 6010 is formed on tenth conductive layer (L10) to penetrate through ninth resin insulation layer (R9). Via conductors (608, 609, 610) are formed in a straight line to form stacked via (60S).

In the first modified example of the embodiment, no solid pattern that causes stray capacitance between through-hole land (L4L) is formed in third conductive layer (L3), which is the upper layer of first-surface (F) side through-hole land (L4L) of a through hole conductor. Opening (L2h) is formed in solid pattern (L2S) of second conductive layer (L2), which is the upper layer of third conductive layer (L3), so that stray capacitance is prevented from occurring between through-hole land (L4L) and solid pattern (L2S).

In eighth conductive layer (L8), which is the upper layer of second-surface (S) side through-hole land (L7L) of the through-hole conductor, opening (L8h) is formed in solid pattern (L8S). Moreover, in ninth conductive layer (L9), which is the upper layer of the eighth conductive layer, opening (L9h) is also formed in solid pattern (L9S) so as to prevent stray capacitance from occurring between through-hole land (L7L) and solid patterns (L8S, L9S).

Second Modified Example of Embodiment

Figure 3:
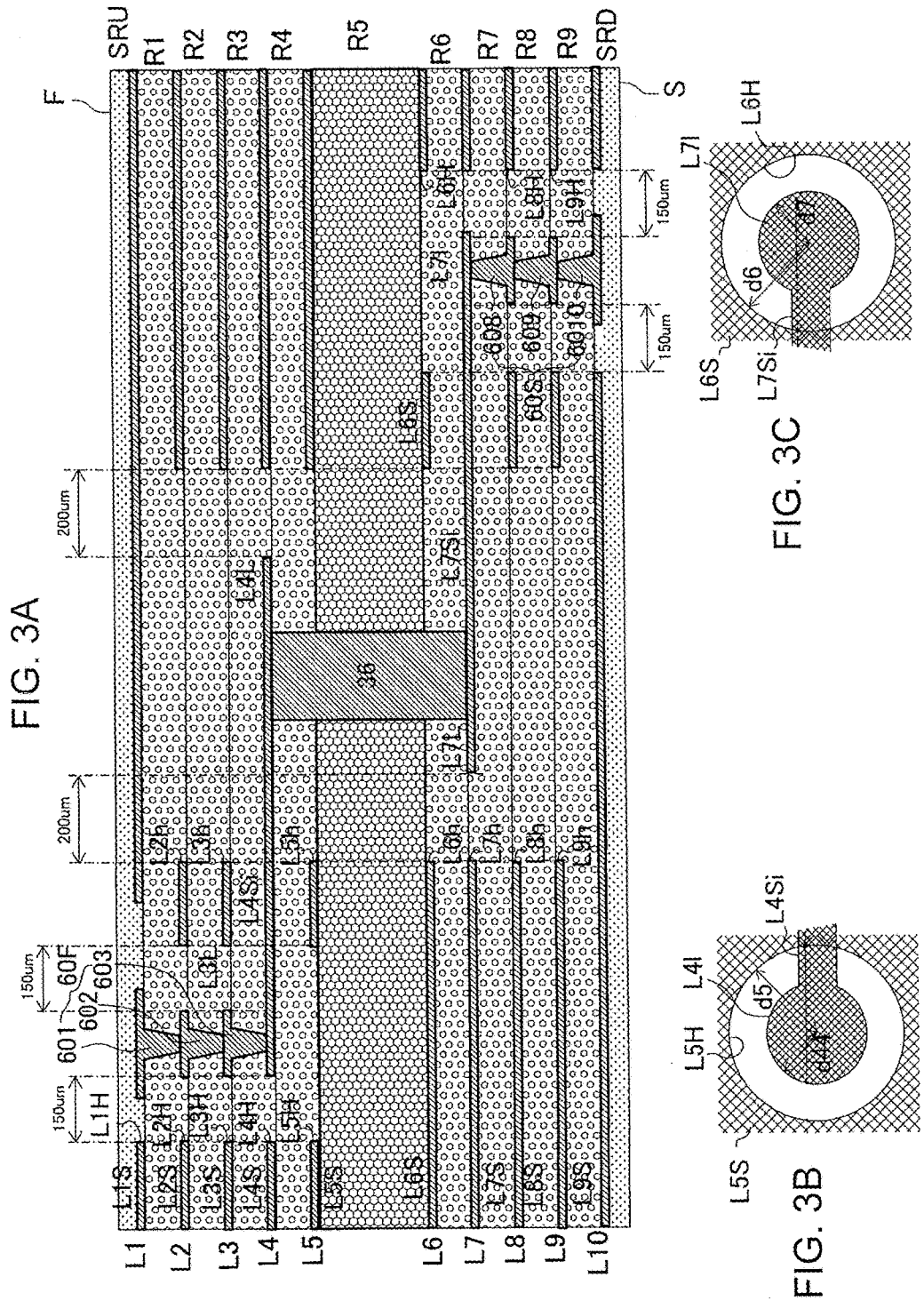
FIG. 3A is a cross-sectional view of a printed wiring board according to a second modified example of the embodiment.
FIG. 3B is a plan view showing fourth and fifth conductive layers seen from the surface (F) side.
FIG. 3C is a plan view showing seventh and sixth conductive layers seen from the surface (S) side.

FIG. 3A shows the structure of a printed wiring board according to a second modified example of the embodiment.

A printed wiring board according to the second modified example of the embodiment is formed by buildup laminating resin insulation layers (R1, R2, R3, R4) and conductive layers (L1, L2, L3, L4) on the first-surface (F) side of fifth resin insulation layer (R5), while buildup laminating resin insulation layers (R6, R7, R8, R9) and conductive layers (L7, L8, L9, L10) on the second-surface (S) side. Fifth conductive layer (L5) is formed on the first-surface side of fifth resin insulation layer (R5), and sixth conductive layer (L6) is formed on the second-surface side. Through-hole conductor 36 penetrates through fourth, fifth, and sixth resin insulation layers (R4, R5, R6).

In the printed wiring board according to the second modified example of the embodiment, opening (L5H) is formed in solid pattern (L5S), positioned opposite land (L4l) formed in fourth conductive layer (L4) connected to the bottom portion of lowermost via conductor 603 of straight stacked via (60F). FIG. 3B is a plan view showing fourth and fifth conductive layers (L4, L5) seen from the first-surface (F) side. Opening (L5H) in solid pattern (L5S) is set to be concentric with land (L4l) formed in fourth conductive layer (L4). Opening (L6H) is formed in solid pattern (L6S), positioned opposite land (L7l) formed in seventh conductive layer (L7) connected to the bottom portion of lowermost via conductor 608 of straight stacked via (60S). FIG. 3C is a plan view showing seventh and sixth conductive layers (L7, L6) seen from the second-surface (S) side. Opening (L6H) in solid pattern (L6S) is set to be concentric with land (L7l) formed in seventh conductive layer (L7).

In the printed wiring board according to the second modified example of the embodiment, opening (L5H) is formed in solid pattern (L5S), positioned opposite land (L4l) formed in fourth conductive layer (L4) connected to the bottom portion of lowermost via conductor 603 of straight stacked via (60F). Opening (L6H) is formed in solid pattern (L6S), positioned opposite land (L7l) formed in seventh conductive layer (L7) connected to the bottom portion of lowermost via conductor 608 of straight stacked via (60S). Opening (L5H) prevents stray capacitance from occurring between land (L4l) of the fourth conductive layer and solid pattern (L5S), while opening (L6H) prevents stray capacitance from occurring between land (L7l) of the seventh conductive layer and solid pattern (L6S) of the sixth conductive layer. Accordingly, impedance increases at stacked vias (60F, 60S), impedance matching is achieved with wiring lines, and attenuation of high-frequency signals is thereby alleviated.

Radius (d44) of land (L4l) formed in the fourth conductive layer (L4) is 50 μm, and radius (d7) of land (L7l) formed in the seventh conductive layer (L7) is 50 μm. The ratio of radius (d5) of opening (L5H) of the fifth conductive layer to radius (d44) of land (L4l) of the fourth conductive layer, as well as the ratio of radius (d6) of opening (L6H) of the sixth conductive layer to radius (d7) of land (L7l) of the seventh conductive layer, is preferred to be at least 2 to 1 but no greater than 3 to 1. A ratio of smaller than 2 to 1 causes stray capacitance to occur between the land and the solid pattern, thus making it difficult to match the impedance. At a ratio of greater than 3 to 1, the effects of enhancing impedance are minimal. In addition, such a ratio reduces the area of solid pattern.

Figure 5:
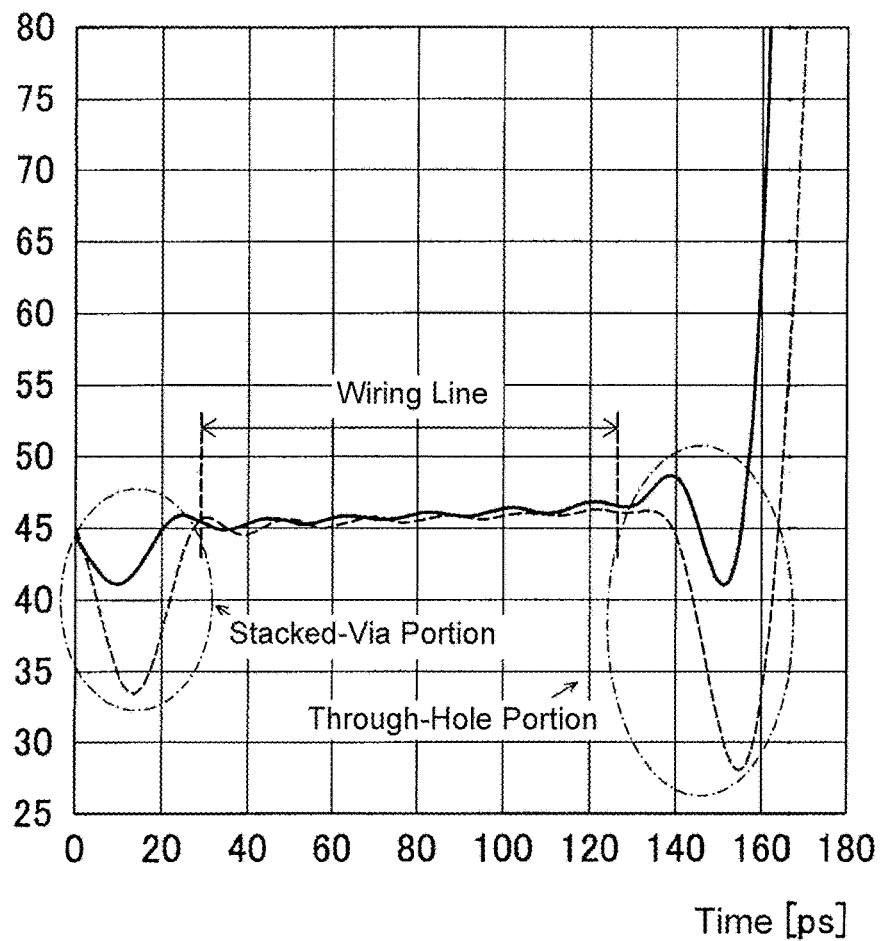
FIG. 5 is a graph showing simulation results of impedance (Z0)

FIG. 5 is a graph showing simulation results of impedance (Z0). Impedance (Z0) is on the vertical axis and time (ps) on the horizontal axis. The dotted line in the graph represents a structure where neither an opening corresponding to a through-hole land nor an opening corresponding to the land on a stacked-via bottom is formed in a solid pattern (pre-improvement), whereas the continuous line represents a situation where the structure of the second modified example of the embodiment is applied (post-improvement). At 0~20 ps, impedance (Z0) is lowered, indicating a reduction in impedance at stacked vias. At 30~125 ps, impedance (Z0) is stable, indicating transmission through wiring lines. At 125~160 ps, impedance (Z0) is lowered, indicating a reduction in impedance at through holes. As shown by continuous line at 0~20 ps, when the structure according to the second modified example of the embodiment is employed, impedance reduction at stacked vias is improved to be approximately ⅓. Also, at 125~160 ps, impedance reduction at through holes is improved to be approximately ⅓.

Figure 4:
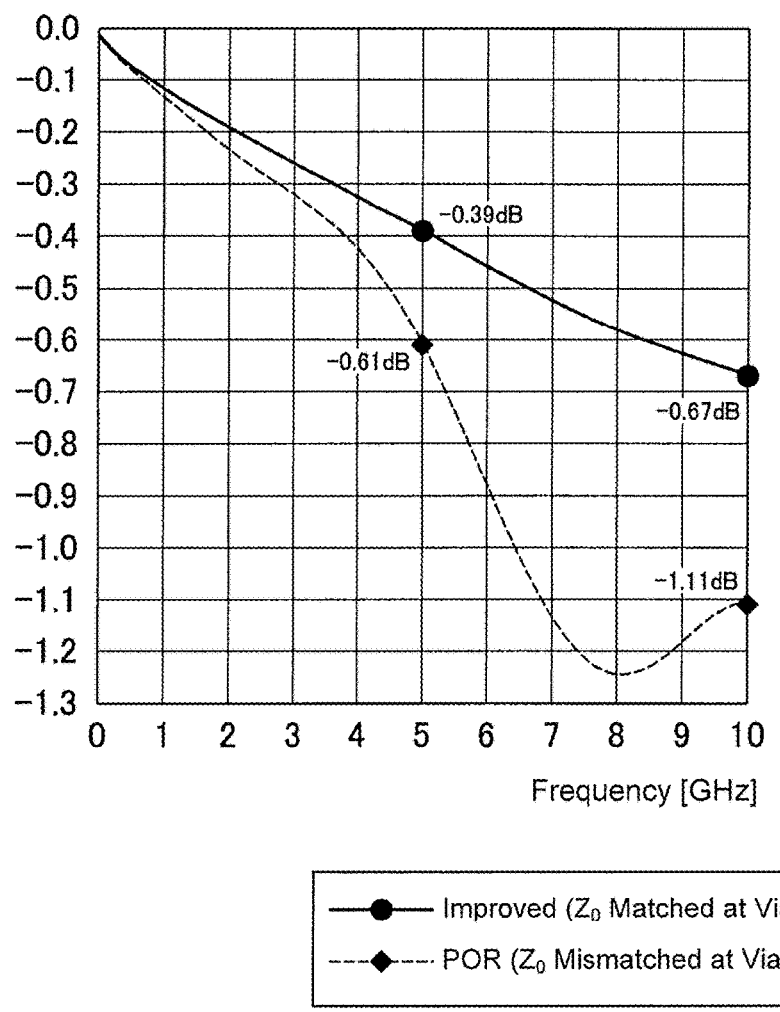
FIG. 4 is a graph showing simulation results of insertion losses at stacked vias and through-hole conductors.

FIG. 4 is a graph showing simulation results of insertion loss at stacked vias and through-hole conductors. Insertion loss (dB) is on the vertical axis, and frequency (GHz) is on the horizontal axis. The dotted line in the graph represents a structure where neither an opening corresponding to a through-hole land nor an opening corresponding to the land on a stacked-via bottom is formed in a solid pattern (pre-improvement), whereas the continuous line represents a situation where the structure of the second modified example of the embodiment is applied (post-improvement). At 5 GHz, pre-improvement insertion loss was 0.61 dB, whereas post-improvement insertion loss was reduced to 0.39 dB. At 10 GHz, compared with pre-improvement insertion loss of 1.11 dB, post-improvement insertion loss was reduced to 0.67 dB.

Third Modified Example of Embodiment

FIG. 6A shows a printed wiring board according to a third modified example of the embodiment.

In a printed wiring board according to the third modified example of the embodiment, penetrating hole 28 in core substrate (R3) for forming through-hole conductor 36 is structured in an hourglass shape, where the diameter gradually decreases from the first-surface (F) side toward the second-surface (S) side, while gradually decreasing from the second-surface (S) side toward the first-surface (F) side. In solid pattern (L2S) of second conductive layer (L2), which is the upper layer of first-surface-side through-hole land (L3L) of a through-hole conductor, opening (L2h) is formed to be concentric with the through-hole land (L3L). In solid pattern (L5S) of fifth conductive layer (L5), which is the upper layer of second-surface-side through-hole land (L4L) of the through-hole conductor, opening (L5h) is formed to be concentric with the through-hole land (L4L). Impedance reduction at through holes is also improved in the printed wiring board according to the third modified example of the embodiment.

Fourth Modified Example of Embodiment

FIG. 6B shows a printed wiring board according to a fourth modified example of the embodiment.

In a printed wiring board according to the fourth modified example of the embodiment, core substrate (R3) is made up of five resin insulation layers, and through-hole conductor 36 is structured to be a stacked via formed of the vias as formed in five resin insulation layers. In solid pattern (L2S) of second conductive layer (L2), which is the upper layer of first-surface-side through-hole land (L3L) of a through-hole conductor, opening (L2h) is formed to be concentric with the through-hole land (L3L). In solid pattern (L5S) of fifth conductive layer (L5), which is the upper layer of second-surface-side through-hole land (L4L) of a through-hole conductor, opening (L5h) is formed to be concentric with the through-hole land (L4L). Impedance reduction at through holes is also improved in the printed wiring board according to the fourth modified example of the embodiment.

To alleviate attenuation of high-frequency signals, impedance matching may be important. It is found that through hole 136, penetrating through multiple resin insulation layers as shown in FIG. 7, has an impedance lower than that in wiring layers on the resin insulation layers. Through hole 136 is connected to signal lines (L4Si, L8Si). Impedance is expressed simply by $\sqrt{(L/C)}$. As shown in the drawing, stray capacitance (C) occurs between upper land (L3L) of the through hole and upper solid pattern (L2), stray capacitance (C) occurs between lower land (L8L) and lower solid pattern (L9S), and stray capacitance (C) occurs between lands (L4L, L5L, L6L, L7L) of the through-hole that penetrates through their respective resin insulation layers (R3, R4, R5, R6, R7) and their respectively adjacent solid patterns (L4S, L5S, L6S, L7S, L8S). Such stray capacitance is thought to cause impedance to be lowered, thereby resulting in impedance mismatching with wiring lines.

A printed wiring board according to an embodiment of the present invention is formed by laminating conductive layers and resin insulation layers, and has through-hole conductors penetrating through the resin insulation layers, and a first surface and a second surface opposite the first surface. A solid pattern is formed over the first surface of the first-surface-side land of a through-hole conductor connected to a signal line, while a solid pattern is formed over the second surface of the second-surface-side land of the through-hole conductor. In the solid pattern over the first surface, an opening is formed to be concentric with the first-surface-side land, corresponding to the first-surface-side land of the through-hole conductor. In the solid pattern over the second surface, an opening is formed to be concentric with the second-surface-side land, corresponding to the second-surface-side land of the through-hole conductor.

In a printed wiring board according to an embodiment, an opening is formed in a first-surface-side solid pattern to be concentric with the first-surface-side land of a through-hole conductor so as to correspond to the first-surface-side land of the through-hole conductor. An opening is formed in a second-surface-side solid pattern to be concentric with the second-surface-side land of the through hole so as to correspond to the second-surface-side land. No stray capacitance occurs between the first-surface-side land of the through-hole conductor and the first-surface-side solid pattern over the land. No stray capacitance occurs between the second-surface-side land of the through-hole conductor and the second-surface-side solid pattern over the land. Accordingly, impedance of the through-hole conductor increases, impedance matching is achieved with wiring lines, and attenuation of high-frequency signals is thereby alleviated.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
   a plurality of conductive layers;
   a plurality of resin insulation layers;
   a through-hole conductor penetrating through at least one of the resin insulation layers such that the through-hole conductor has a first-surface-side land and a second-surface-side land;
   a first-surface-side signal line formed on one of the resin insulation layers such that the first-surface-side signal line is connecting the first-surface-side land and one of the conductive layers on the one of the resin insulation layers; and
   a second-surface-side signal line formed on one of the resin insulation layers such that the second-surface-side signal line is connecting the second-surface-side land and one of the conductive layers on the one of the resin insulation layers,
   wherein the plurality of conductive layers includes a first-surface-side conductive layer formed over the first-surface-side land of the through-hole conductor such that the first-surface-side conductive layer has a solid pattern having an opening portion corresponding to the first-surface-side land and formed concentric with the first-surface-side land, and a second-surfaceside conductive layer formed over the second-surface-side land of the through-hole conductor such that the second-surface-side conductive layer has a solid pattern having an opening portion corresponding to the second-surface-side land and formed concentric with the second-surface-side land.

2. A printed wiring board according to claim 1, wherein the solid pattern of the first-surface-side conductive layer has the opening portion formed concentric with the first-surface-side land such that a diameter of the opening portion is in a range of 2 to 3 times a diameter of the first-surface-side land, and the solid pattern of the second-surface-side conductive layer has the opening portion formed concentric with the second-surface-side land such that a diameter of the opening portion is in a range of 2 to 3 times a diameter of the second-surface-side land.

3. A printed wiring board according to claim 2, wherein the first-surface-side conductive layer is formed over the first-surface-side land of the through-hole conductor such that the first-surface-side conductive layer is formed across one layer of the resin insulation layers, and the second-surface-side conductive layer is formed over the second-surface-side land of the through-hole conductor such that the second-surface-side conductive layer is formed across one layer of the resin insulation layers.

4. A printed wiring board according to claim 2, wherein the plurality of conductive layers includes the first-surface-side conductive layer formed in a plurality, and the second-surface-side conductive layer formed in a plurality.

5. A printed wiring board according to claim 2, wherein the through-hole conductor is formed such that the through-hole conductor is penetrating through plural layers of the conductive layers and plural layers of the resin insulation layers and that the through-hole conductor does not have a dummy land which is not connected to a power source and a ground.

6. A printed wiring board according to claim 2, further comprising:
a stacked via structure comprising a plurality of via conductors formed in plural layers of the resin insulation layers, respectively, such that a lowermost via conductor of the via conductors has a bottom portion formed on a land portion of the one of the conductive layers connected to the first-surface-side signal line and that the first-surface-side signal line is connecting the stacked via structure and the first-surface-side land of the through-hole conductor via the land portion,
wherein the plurality of conductive layers includes a conductive layer formed across at least one layer of the resin insulation layers and having a solid pattern such that the solid pattern of the conductive layer has an opening portion corresponding to and formed concentric with the land portion connected to the bottom portion of the lowermost via conductor.

7. A printed wiring board according to claim 2, wherein the plurality of resin insulation layers has a dielectric constant in a range of 3.6 to 4.3.

8. A printed wiring board according to claim 2, wherein the through-hole conductor is formed such that the through-hole conductor is penetrating through plural layers of the conductive layers and plural layers of the resin insulation layers.

9. A printed wiring board according to claim 2, further comprising:
a stacked via structure comprising a plurality of via conductors formed in plural layers of the resin insulation layers, respectively, such that a lowermost via conductor of the via conductors has a bottom portion formed on a land portion of the one of the conductive layers connected to the first-surface-side signal line and that the first-surface-side signal line is connecting the stacked via structure and the first-surface-side land of the through-hole conductor via the land portion.

10. A printed wiring board according to claim 1, wherein the first-surface-side conductive layer is formed over the first-surface-side land of the through-hole conductor such that the first-surface-side conductive layer is formed across one layer of the resin insulation layers, and the second-surface-side conductive layer is formed over the second-surface-side land of the through-hole conductor such that the second-surface-side conductive layer is formed across one layer of the resin insulation layers.

11. A printed wiring board according to claim 10, wherein the plurality of conductive layers includes the first-surface-side conductive layer formed in a plurality, and the second-surface-side conductive layer formed in a plurality.

12. A printed wiring board according to claim 10, wherein the through-hole conductor is formed such that the through-hole conductor is penetrating through plural layers of the conductive layers and plural layers of the resin insulation layers and that the through-hole conductor does not have a dummy land which is not connected to a power source and a ground.

13. A printed wiring board according to claim 10, further comprising:
a stacked via structure comprising a plurality of via conductors formed in plural layers of the resin insulation layers, respectively, such that a lowermost via conductor of the via conductors has a bottom portion formed on a land portion of the one of the conductive layers connected to the first-surface-side signal line and that the first-surface-side signal line is connecting the stacked via structure and the first-surface-side land of the through-hole conductor via the land portion,
wherein the plurality of conductive layers includes a conductive layer formed across at least one layer of the resin insulation layers and having a solid pattern such that the solid pattern of the conductive layer has an opening portion corresponding to and formed concentric with the land portion connected to the bottom portion of the lowermost via conductor.

14. A printed wiring board according to claim 10, wherein the plurality of resin insulation layers has a dielectric constant in a range of 3.6 to 4.3.

15. A printed wiring board according to claim 1, wherein the plurality of conductive layers includes the first-surface-side conductive layer formed in a plurality, and the second-surface-side conductive layer formed in a plurality.

16. A printed wiring board according to claim 1, wherein the through-hole conductor is formed such that the through-hole conductor is penetrating through plural layers of the conductive layers and plural layers of the resin insulation layers and that the through-hole conductor does not have a dummy land which is not connected to a power source and a ground.

17. A printed wiring board according to claim 1, further comprising:
a stacked via structure comprising a plurality of via conductors formed in plural layers of the resin insulation layers, respectively, such that a lowermost via conductor of the via conductors has a bottom portion formed on a land portion of the one of the conductive layers connected to the first-surface-side signal line and that the first-surface-side signal line is connecting the stacked via structure and the first-surface-side land of the through-hole conductor via the land portion, wherein the plurality of conductive layers includes a conductive layer formed across at least one layer of the resin insulation layers and having a solid pattern such that the solid pattern of the conductive layer has an opening portion corresponding to and formed concentric with the land portion connected to the bottom portion of the lowermost via conductor.

18. A printed wiring board according to claim 1, wherein the plurality of resin insulation layers has a dielectric constant in a range of 3.6 to 4.3.

19. A printed wiring board according to claim 1, wherein the through-hole conductor is formed such that the through-hole conductor is penetrating through plural layers of the conductive layers and plural layers of the resin insulation layers.

20. A printed wiring board according to claim 1, further comprising:

a stacked via structure comprising a plurality of via conductors formed in plural layers of the resin insulation layers, respectively, such that a lowermost via conductor of the via conductors has a bottom portion formed on a land portion of the one of the conductive layers connected to the first-surface-side signal line and that the first-surface-side signal line is connecting the stacked via structure and the first-surface-side land of the through-hole conductor via the land portion.

* * * * *